(12) United States Patent
Kono

(10) Patent No.: US 11,923,461 B2
(45) Date of Patent: Mar. 5, 2024

(54) SEMICONDUCTOR DEVICE

(71) Applicant: DENSO CORPORATION, Kariya (JP)

(72) Inventor: Kenji Kono, Kariya (JP)

(73) Assignee: DENSO CORPORATION, Kariya (JP)

( * ) Notice: Subject to any disclaimer, the term of this patent is extended or adjusted under 35 U.S.C. 154(b) by 455 days.

(21) Appl. No.: 17/351,586

(22) Filed: Jun. 18, 2021

(65) Prior Publication Data

US 2021/0313475 A1 Oct. 7, 2021

Related U.S. Application Data

(63) Continuation of application No. PCT/JP2020/001327, filed on Jan. 16, 2020.

(30) Foreign Application Priority Data

Jan. 21, 2019 (JP) ................... 2019-007845

(51) Int. Cl.
| | | |
|---|---|---|
| *H01L 23/00* | (2006.01) | |
| *H01L 29/08* | (2006.01) | |
| *H01L 29/10* | (2006.01) | |
| *H01L 29/40* | (2006.01) | |
| *H01L 29/423* | (2006.01) | |
| *H01L 29/808* | (2006.01) | |

(52) U.S. Cl.
CPC ...... *H01L 29/8083* (2013.01); *H01L 29/0843* (2013.01); *H01L 29/1058* (2013.01); *H01L 29/1095* (2013.01); *H01L 29/407* (2013.01); *H01L 29/42316* (2013.01)

(58) Field of Classification Search
CPC ............ H01L 29/8083; H01L 29/0843; H01L 29/1095
See application file for complete search history.

(56) References Cited

U.S. PATENT DOCUMENTS

| | | | |
|---|---|---|---|
| 5,945,701 A | 8/1999 | Siergiej et al. | |
| 6,870,189 B1 | 3/2005 | Harada et al. | |
| 7,279,368 B2 | 10/2007 | Harris et al. | |
| 2002/0190258 A1 | 12/2002 | Harada | |
| 2005/0056872 A1 | 3/2005 | Harada et al. | |
| 2005/0127396 A1 | 6/2005 | Mitra et al. | |
| 2007/0241338 A1 | 10/2007 | Yamamoto et al. | |
| 2007/0252178 A1 | 11/2007 | Onose | |

(Continued)

FOREIGN PATENT DOCUMENTS

| | | |
|---|---|---|
| JP | 2005005385 A | 1/2005 |
| JP | 2013222933 A | 10/2013 |
| JP | 2014220434 A | 11/2014 |

*Primary Examiner* — Anthony Ho
(74) *Attorney, Agent, or Firm* — POSZ LAW GROUP, PLC

(57) ABSTRACT

A semiconductor device includes a drift layer, a channel layer, a source layer being the first conductivity type, a gate layer, a body layer, a shield layer and a drain layer. The channel is disposed on the drift layer. The source layer is disposed on a surface layer portion of the channel layer. The gate layer is arranged to be deeper than the source layer. The body layer is arranged to be deeper than the source layer. The shield layer is disposed at a portion of the channel layer between the gate layer and the drift layer. The shield layer is maintained at a potential different from a potential of the gate layer. The drain layer is disposed at a side opposite to the channel layer. A depth ratio of a depth of the gate layer to a depth of the body layer is equal to or larger than 0.45.

4 Claims, 2 Drawing Sheets

(56) References Cited

U.S. PATENT DOCUMENTS

2009/0278137 A1 11/2009 Sheridan et al.
2014/0231883 A1 8/2014 Esteve et al.
2014/0346528 A1 11/2014 Hisada et al.
2016/0035904 A1 2/2016 Hisada et al.

SEMICONDUCTOR DEVICE

CROSS REFERENCE TO RELATED APPLICATIONS

The present application is a continuation application of International Patent Application No. PCT/JP2020/001327 filed on Jan. 16, 2020, which designated the U.S. and claims the benefit of priority from Japanese Patent Application No. 2019-007845 filed on Jan. 21, 2019. The entire disclosures of all of the above applications are incorporated herein by reference.

TECHNICAL FIELD

The present disclosure relates to a semiconductor device.

BACKGROUND

There has been known a semiconductor device formed with a junction-type field effect transistor (JFET). Such a semiconductor device has a semiconductor substrate in which a drain layer, a drift layer, and a channel layer are stacked.

SUMMARY

The present disclosure describes to a semiconductor device including a drift layer, a channel layer, a source layer, a gate layer, a body layer, a shield layer and a drain layer.

BRIEF DESCRIPTION OF DRAWINGS

Objects, features and advantages of the present disclosure will become more apparent from the following detailed description made with reference to the accompanying drawings. In the drawings.

DETAILED DESCRIPTION

Figure 1:
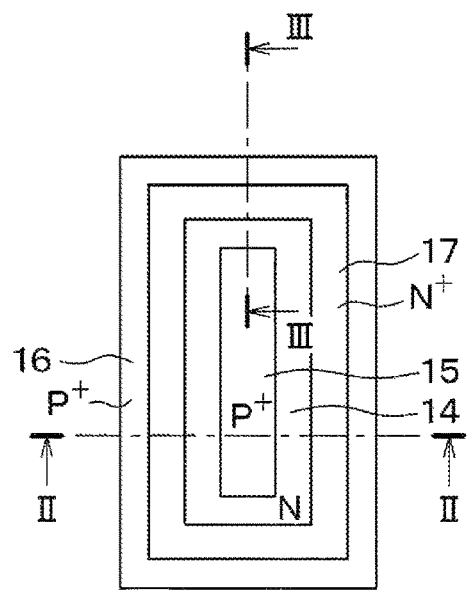
FIG. 1 is a plan view of one cell of a semiconductor device according to a first embodiment.

A semiconductor device formed with a JFET may have a semiconductor substrate in which an $N^+$ type drain layer, an $N^-$ type drift layer, and an N type channel layer are sequentially stacked. In the surface portion of the channel layer, an $N^+$ type source layer may be formed. Further, in the channel layer, a $P^+$ type gate layer may be formed so as to penetrate the source layer, and a $P^+$ type body may be formed at a position away from the gate layer.

In the semiconductor device having the above configuration, since the body layer is formed, if a surge current is generated, the surge current can be discharged from the body layer. Therefore, it is possible to restrict the surge current from concentrating on the gate layer.

In such a semiconductor device, for example, it may be desirable to reduce the switching loss by reducing a Miller capacitance ratio. Therefore, the inventors in the present application have conducted diligent studies and found that the Miller capacitance ratio can be reduced by arranging a shield layer, which is maintained at a potential different from that of the gate layer, between the gate layer and the drift layer. Then, the inventors in the present application have studied that it is possible to further reduce the Miller capacitance ratio for the semiconductor device.

According to an aspect of the present disclosure, a semiconductor device includes a drift layer being a first conductivity type, a channel layer being the first conductivity type, a source layer being the first conductivity type, a gate layer being a second conductivity type, a body layer being the second conductivity type, a shield layer and a drain layer. The channel is disposed on the drift layer. The source layer has a higher impurity concentration than the channel layer, and is disposed on a surface layer portion of the channel layer. The gate layer is disposed at the channel layer and arranged to be deeper than the source layer. The body layer is disposed at the channel layer. The body layer is arranged to be deeper than the source layer. The body layer is separated from the gate layer. The shield layer is disposed at a portion of the channel layer located between the gate layer and the drift layer. The shield layer faces the gate layer while being separated from the gate layer. The shield layer is maintained at a potential different from a potential of the gate layer. The drain layer is disposed at a side opposite to the channel layer so that the drift layer is sandwiched between the drain layer and the channel layer. A depth ratio of a depth of the gate layer to a depth of the body layer is equal to or smaller than 0.45.

Therefore, it is possible to significantly reduce the Miller capacitance ratio since the depth ratio is equal to or smaller than 0.45.

Embodiments of the present disclosure will be hereinafter described with reference to the drawings. In the following embodiments, the same or equivalent parts are denoted by the same reference numerals for description.

(First Embodiment)

Figure 2:
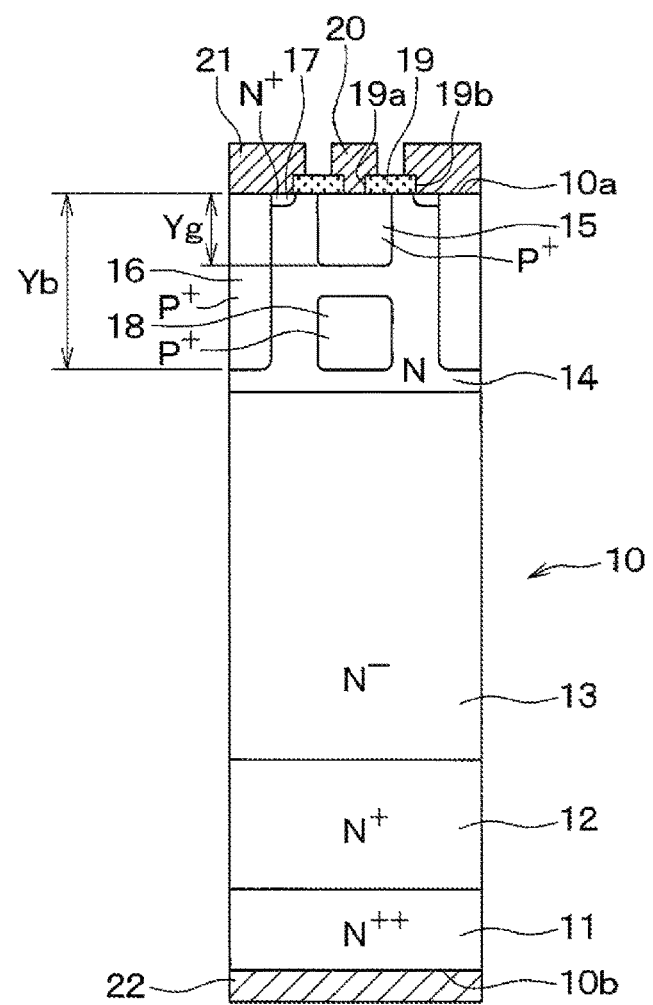
FIG. 2 is a cross-sectional view taken along a line II-II shown in FIG. 1.
Figure 3:
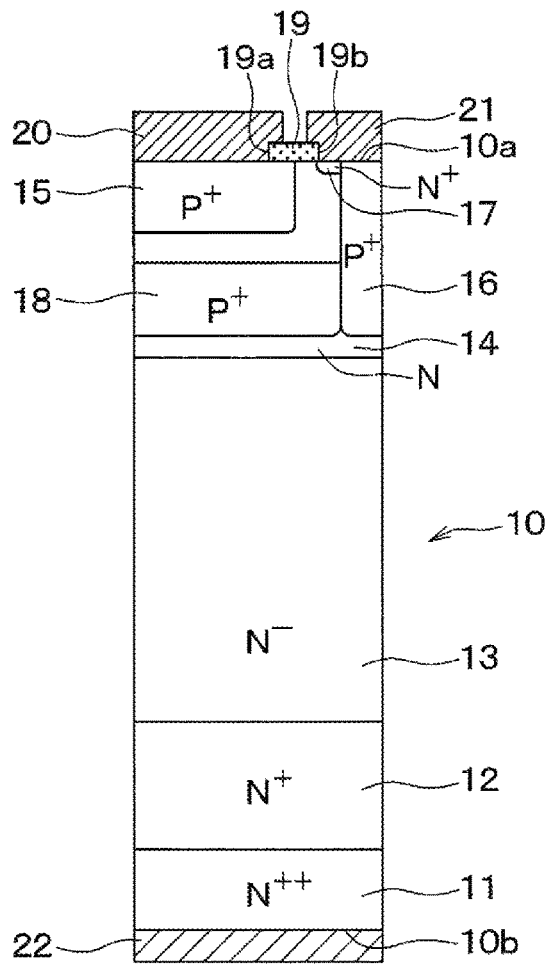
FIG. 3 is a cross-sectional view taken along line III-III shown in FIG. 1.

A first embodiment will be described with reference to FIGS. 1 to 3. The following describes the structure of a semiconductor device in which a junction type field effect transistor (hereinafter referred to as JFET) according to the present embodiment. FIG. 1 is a plan view that illustrates one cell portion of the JFET according to the present embodiment, and the semiconductor device has multiple cells arranged to be adjacent to each other. FIG. 1 omits the illustration of, for example, an interlayer insulation film 19, a gate electrode 20 and an upper electrode 21.

The semiconductor device includes a semiconductor substrate 10 having a drain layer 11 and formed of an $N^{++}$ type silicon carbide (hereinafter also referred to as "SiC") substrate. Then, an $N^+$ type buffer layer 12 having an impurity concentration lower than that of the drain layer 11 is disposed on the drain layer 11, and an $N^-$ type drift layer 13 having an impurity concentration lower than that of the buffer layer 12 is disposed on the buffer layer 12. The buffer layer 12 and the drift layer 13 are formed, for example, by growing an epitaxial film made of SiC on the SiC substrate forming the drain layer 11.

An N type channel layer 14 having a higher impurity concentration than the drift layer 13 is disposed on the drift layer 13. The channel layer 14 is formed by growing an epitaxial film of SiC. In the present embodiment, the semiconductor substrate 10 has a first surface 10a including the surface of the channel layer 14.

Furthermore, a $P^+$ type gate layer 16 and a $P^+$ type body layer 17, which are higher in impurity concentration than the channel layer 14, are formed at the channel layer 14. In the present embodiment, the body layer 16 is formed in a quadrilateral shape having a first direction as a longitudinal direction in a plan view of the once-cell region. In FIG. 1, it is formed in a quadrilateral shape having a vertical direction as viewed on the drawing paper of FIG. 1 as the longitudinal direction. The gate layer 15 has a rectangular shape with the longitudinal direction of the body layer 16 as the longitudinal direction in a plan view of the one-cell region, and is disposed within the body layer 16 while being disposed away from the body layer 16.

In a situation where the thickness direction of the semiconductor substrate is defined as the depth direction, the gate layer 15 and the body layer 16 are formed along the depth direction from the first surface 10a of the semiconductor substrate 10, in other words, from the surface of the channel layer 14. The body layer 16 is formed to be deeper than the gate layer 15. In other words, the depth direction of the semiconductor substrate 10 may also be referred to as the stacking direction of the drain layer 11, the drift layer 13 and the channel layer 14.

Further, at the surface layer portion of the channel layer 14, an $N^+$ type source layer 17 having a higher impurity concentration than the channel layer 14 is formed so as to be in contact with the body layer 16. Although not particularly limited, in the present embodiment, the gate layer 15 and the body layer 16 have an impurity concentration about 10 times higher than the impurity concentration of the channel layer 14. As illustrated in FIG. 2, in a situation where the longitudinal direction is normal to a cross sectional view of the semiconductor device, in the cross sectional view, the channel layer 14 extends from a bottom of the source layer to the surface of the drift layer 13 in the stacking direction.

A shield layer 18 is formed at the channel layer 14 such that the shield layer 18 is formed to a position deeper than the gate layer 15 while being separated from the gate layer 15 and facing the gate layer 15. In other words, the shield layer 18 facing the gate layer 15 is formed at a part of the channel layer 14 located between the gate layer 15 and the drift layer 13. As illustrated in FIG. 2, in the cross sectional view of the semiconductor device, the shield layer 18 is disposed at a location between a center of the gate layer 15 in a width direction, which is perpendicular to the stacking direction and the longitudinal direction, and the drift layer 13.

In the present embodiment, the shield layer 18 is formed as the $P^+$ type with the impurity concentration identical to the body layer 16, and is formed as a rectangular shape along the longitudinal direction of the gate layer 15 in a plan view. The length of the shield layer 18 in the longitudinal direction is longer than the length of the gate layer 15 in the longitudinal direction. The shield layer 18 is electrically connected to the body layer 16 by connecting the both end portion of the shield layer 18 to the body layer 16. That is, the shield layer 18 of the present embodiment has a potential identical to the potential of the body layer 16. In the present embodiment. The shield layer 18 is thus maintained at a potential different from the potential of the gate layer 15.

The interlayer insulation film 19 is formed on the first surface 10a of the semiconductor substrate 10. The interlayer insulation film 19 is formed with a first contact hole 19a for exposing the gate layer 15 and a second contact hole 19b for exposing the body layer 16 and the source layer 17. On the interlayer insulation film 19, the gate electrode 20 is arranged to be electrically connected with the gate layer 15 through a first contact hole 19a. An upper electrode 21 electrically connected to the body layer 16 and the source layer 17 through the second contact hole 19b is formed on the interlayer insulation film 19.

A lower electrode 22 electrically connected to the drain layer 11 is formed on the other surface 10b of the semiconductor substrate 10.

The basic structure of the semiconductor device according to the present embodiment is described above. In the present embodiment, $N^-$ type, N type, $N^+$ type and $N^{++}$ type correspond to the first conductivity type, and $P^+$ type corresponds to the second conductivity type. Further, in the present embodiment, as described above, the semiconductor substrate 10 includes the drain layer 11, the buffer layer 12, the drift layer 13, the channel layer 14, the gate layer 15, the body layer 16 and the source layer 17. Further, in the present embodiment, as described above, the drain layer 11 is formed of a SiC substrate, and the buffer layer 12, the drift layer 13, the channel layer 14 and the like are formed by growing an epitaxial film made of SiC. Therefore, the semiconductor device of the present embodiment may be defined as a SiC semiconductor device.

The semiconductor device as described above may be a normally-on transistor in which a current flows between the upper electrode 21 and the lower electrode 22 in a situation where a predetermined gate voltage is not applied to the gate layer 15.

Since the body layer 16 is formed, in a situation where a surge current is generated, the surge current flows to the body layer 16. Therefore, it is possible to restrict the surge current from concentrating on the gate layer. The shield layer 18, which is connected to the body layer 16, is formed below the gate layer 15. Therefore, the Miller capacitance ratio can be reduced, and the switching loss can be reduced.

The following describes the ratio between the depth of the gate layer 15 and the depth of the body layer 16 in the semiconductor device according to the present embodiment. As illustrated in FIG. 2, the depth of the gate layer 15 from the first surface 10a of the semiconductor substrate 10 is defined as Yg, and the depth of the body layer 16 from the first surface 10a of the semiconductor substrate 10 is defined as Yb. The ratio of the depth Yg of the date layer 15 to the depth Yb of the body layer 16 (in other words, Yg/Yb) is regarded as a depth ratio. The capacitance between the gate and the drain is regarded as Cgd. The capacitance between the gate and the source is regarded as Cgs. The ratio of Cgd to Cgs is regarded as a Miller capacitance ratio (in other words, Cgd/Cgs). It can be said that the depth of the gate layer 15 is the length between the first surface 10a and the bottom surface of the gate layer 15. It can be said that the depth of the body layer 16 is the length between the first surface 10a and the bottom surface of the body layer 16.

Figure 4:
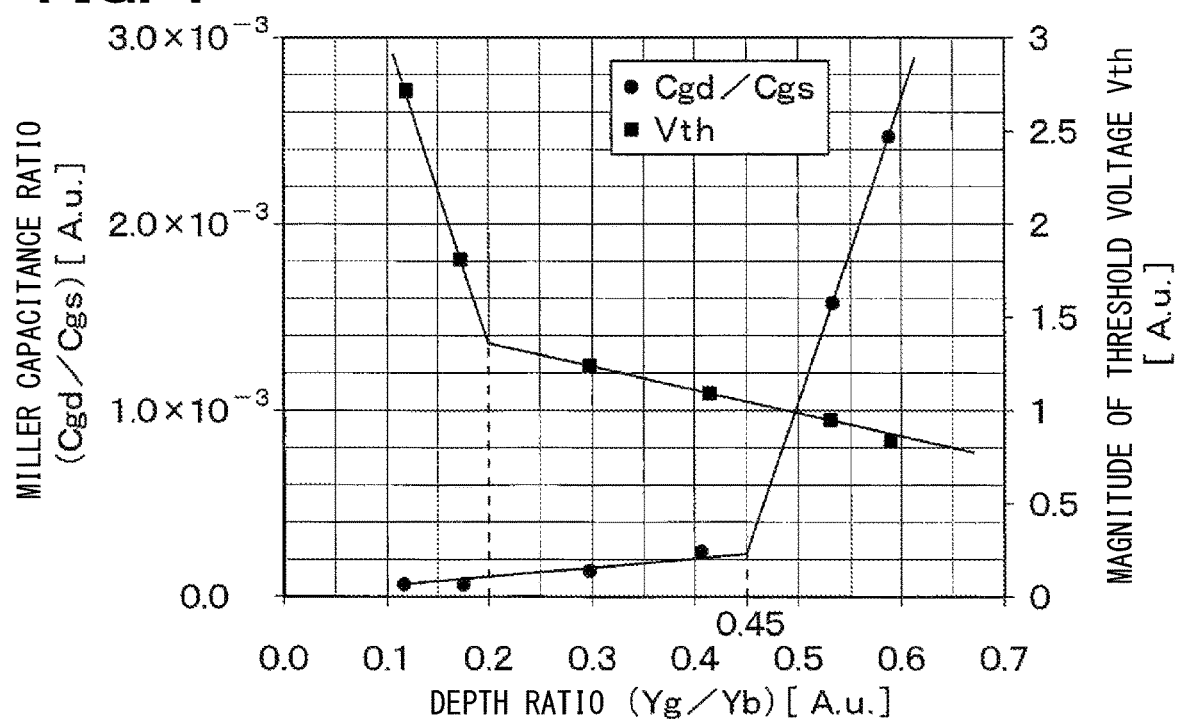
FIG. 4 illustrates a simulation result of the relationship among a depth ratio, a mirror capacitance ratio, and the magnitude of a threshold voltage.

The inventors in the present application reviewed the relation among the depth ratio, the Miller capacitance ratio and the magnitude of the threshold voltage applied to the gate layer 15 for blocking the current, and obtained the simulation result illustrated in FIG. 4.

As illustrated in FIG. 4, it is confirmed that the Miller capacitance ratio increases as the depth ratio increases, since the distance from the drain layer 11 decreases as the depth ratio increases by deepening the depth of the gate layer 15. In particular, it is confirmed that the Miller capacitance ratio gradually increases as the depth ratio increases in a range where the depth ratio is less than or equal to 0.45, and it is confirmed that the Miller capacitance ratio steeply increases as the depth ratio increases in a range where the depth ratio is larger than 0.45. Therefore, in the present embodiment, the gate layer 15 and the body layer 16 are formed such that the depth ratio is less than or equal to 0.45. In other words, in the present embodiment, the gate layer 15 and the body layer 16 are formed such that the Miller capacitance ratio can be sufficiently reduced.

It is confirmed that the magnitude of the threshold voltage decreases as the depth ratio increases, since the channel control becomes similar as the depth ratio is enlarged by deepening the depth of the gate layer 15. In particular, it is confirmed that the magnitude of the threshold voltage steeply decreases as the depth ratio increases in a range where the depth ratio is less than 0.2, and it is confirmed that the magnitude of the threshold voltage gradually decreases as the depth ratio increases in a range where the depth ratio is larger than 0.2. Therefore, in the present embodiment, the gate layer 15 and the body layer 16 are formed such that the depth ratio is larger than or equal to 0.2. In other words, in the present embodiment, the gate layer 15 and the body layer 16 are formed such that the magnitude of the threshold voltage can be reduced.

As described above, in the present embodiment, the gate layer 15 and the body layer 16 are formed such that the depth ratio is less than or equal to 0.45. Therefore, the Miller capacitance ratio can be sufficiently reduced.

Therefore, in the present embodiment, the gate layer 15 and the body layer 16 are formed such that the depth ratio is larger than or equal to 0.2. Therefore, it is possible to suppress an increase in the magnitude of the threshold voltage.

The shield layer 18 is maintained at the potential of the body layer 16 by connecting the body layer 16. Therefore, the potential of the shield layer 18 can be easily maintained at a potential different from the potential of the gate layer 15. Since it is not necessary to provide an electrode electrically connected to the shield layer 18 as the shield layer 18 is connected to the body layer 16, it is possible to avoid the complexity of the structure.

(Other Embodiments)

Although the present disclosure has been described in accordance with the embodiments, it is understood that the present disclosure is not limited to such embodiments or structures. The present disclosure encompasses various modifications and variations within the scope of equivalents. In addition, various combinations and forms, and further, other combinations and forms including only one element, or more or less than these elements are also within the scope and the scope of the present disclosure.

For example, according to the first embodiment, an example has been described in which the first conductivity type is N-type and the second conductivity type is P-type, but the first conductivity type may be P-type and the second conductivity type may be N-type.

In the first embodiment, the SiC semiconductor device has been described as an example. Alternatively, another compound semiconductor device or a semiconductor device formed by hetero-epitaxy growth on a silicon substrate may be used.

In the first embodiment, the shield layer 18 may be connected to the body layer 16, for example, in a direction intersecting the longitudinal direction. Further, the shield layer 18 may not be connected to the body layer 16 as long as it is maintained at a potential different from the potential of the gate layer 15.

The present disclosure has been described based on examples, but it is understood that the present disclosure is not limited to the examples or structures. The present disclosure encompasses various modifications and variations within the scope of equivalents. In addition, various combinations and configurations, as well as other combinations and configurations that include only one element, more, or less, fall within the scope and spirit of the present disclosure.

What is claimed is:

1. A semiconductor device comprising:
   a drift layer of a first conductivity type;
   a channel layer of the first conductivity type disposed on a surface of the drift layer;
   a source layer of the first conductivity type having a higher impurity concentration than the channel layer, the source layer disposed on a surface layer portion of the channel layer;
   a gate layer of a second conductivity type disposed at the channel layer and arranged to be deeper than the source layer;
   a body layer of the second conductivity type disposed at the channel layer, the body layer arranged to be deeper than the source layer while being separated from the gate layer;
   a shield layer disposed at a part of the channel layer located between the gate layer and the drift layer, the shield layer facing the gate layer while being separated from the gate layer, the shield layer maintained at a potential different from a potential of the gate layer; and
   a drain layer disposed at a side opposite to the channel layer so that the drift layer is sandwiched between the drain layer and the channel layer,
   wherein a depth ratio of a depth of the gate layer to a depth of the body layer is equal to or smaller than 0.45,
   wherein the semiconductor device has a junction-type field effect transistor,
   wherein the drift layer the channel layer are stacked in a stacking direction,
   wherein the gate layer is extended in a direction being a longitudinal direction, as viewed in the stacking direction,
   wherein the body layer is arranged along the stacking direction,
   wherein the longitudinal direction is normal to a cross sectional view of the semiconductor device,
   wherein, in the cross sectional view, the channel layer extends from a bottom of the source layer to the surface of the drift layer in the stacking direction and
   wherein, in the cross sectional view, the shield layer is disposed at a location between a center of the gate layer in a width direction, which is perpendicular to the stacking direction and the longitudinal direction, and the drift layer.

2. The semiconductor device according to claim 1, wherein the depth ratio is equal to or larger than 0.2.

3. The semiconductor device according to claim 1, wherein the shield layer has a potential identical to a potential of the body layer.

4. The semiconductor device according to claim 3, wherein the shield layer is connected to the body layer to have the potential identical to the potential of the body layer.

* * * * *